US011175243B1

(12) United States Patent
Yun et al.

(10) Patent No.: US 11,175,243 B1
(45) Date of Patent: Nov. 16, 2021

(54) X-RAY DARK-FIELD IN-LINE INSPECTION FOR SEMICONDUCTOR SAMPLES

(71) Applicant: Sigray, Inc., Concord, CA (US)

(72) Inventors: Wenbing Yun, Walnut Creek, CA (US); Sylvia Jia Yun Lewis, San Francisco, CA (US); Janos Kirz, Berkeley, CA (US)

(73) Assignee: Sigray, Inc., Concord, CA (US)

( * ) Notice: Subject to any disclaimer, the term of this patent is extended or adjusted under 35 U.S.C. 154(b) by 0 days.

(21) Appl. No.: 17/167,870

(22) Filed: Feb. 4, 2021

Related U.S. Application Data

(60) Provisional application No. 62/971,062, filed on Feb. 6, 2020.

(51) Int. Cl.
  *G01N 23/20* (2018.01)
  *G01N 23/083* (2018.01)
  (Continued)

(52) U.S. Cl.
  CPC ........... *G01N 23/083* (2013.01); *G01N 23/04* (2013.01); *G01N 23/18* (2013.01);
  (Continued)

(58) Field of Classification Search
  None
  See application file for complete search history.

(56) References Cited

U.S. PATENT DOCUMENTS

| 4,642,811 A | 2/1987 | Georgopoulos |
| 4,945,552 A | 7/1990 | Ueda |

(Continued)

FOREIGN PATENT DOCUMENTS

| CN | 101257851 B | 9/2008 |
| CN | 101532969 B | 9/2009 |

(Continued)

OTHER PUBLICATIONS

"High performance benchtop EDXRF spectrometer with Windows®® software," published by: Rigaku Corp., Tokyo, Japan; 2017.

(Continued)

*Primary Examiner* — Hoon K Song
(74) *Attorney, Agent, or Firm* — Knobbe, Martens, Olson, Bear, LLP

(57) ABSTRACT

An x-ray imaging/inspection system includes an x-ray source having a plurality of sub-sources in thermal communication with a substrate. The system further includes a first grating positioned to receive at least some of the x-rays from the x-ray source, a stage configured to hold a sample positioned to receive at least some of the x-rays from the x-ray source, at least one x-ray detector, and a second grating having periodic structures. The x-ray source, the first grating, and the second grating are configured such that a ratio of a pitch $p_0$ of the plurality of sub-sources to a pitch $p_2$ of the periodic structures of the second grating is substantially equal to a ratio of a distance $d_{S-G1}$ between the plurality of sub-sources and the first grating and a distance $d_{G1-G2}$ between the first grating and the second grating: $(p_0/p_2) = (d_{S-G1}/d_{G1-G2})$.

17 Claims, 4 Drawing Sheets

(51) Int. Cl.
*G01N 23/04* (2018.01)
*G01N 23/18* (2018.01)
(52) U.S. Cl.
CPC .......... *G01N 2223/204* (2013.01); *G01N 2223/6116* (2013.01); *G01N 2223/646* (2013.01)

(56) References Cited

U.S. PATENT DOCUMENTS

| | | |
|---|---|---|
| 5,132,997 A | 7/1992 | Kojima |
| 5,173,928 A | 12/1992 | Momose et al. |
| 5,204,887 A | 4/1993 | Hayashida et al. |
| 5,220,591 A | 6/1993 | Ohsugi et al. |
| 5,249,216 A | 9/1993 | Ohsugi et al. |
| 5,280,176 A | 1/1994 | Jach et al. |
| 5,778,039 A | 7/1998 | Hossain |
| 5,812,629 A | 9/1998 | Clauser |
| 5,832,052 A | 11/1998 | Hirose et al. |
| 5,912,940 A | 6/1999 | O'Hara |
| 6,108,398 A | 8/2000 | Mazor et al. |
| 6,181,773 B1 | 1/2001 | Lee et al. |
| 6,195,410 B1 | 2/2001 | Cash, Jr. |
| 6,226,347 B1 | 5/2001 | Golenhofen |
| 6,381,303 B1 | 4/2002 | Vu et al. |
| 6,430,254 B2 | 8/2002 | Wilkins |
| 6,442,231 B1 | 8/2002 | O'Hara |
| 6,456,688 B1 | 9/2002 | Taguchi et al. |
| 6,504,902 B2 | 1/2003 | Iwasaki et al. |
| 6,611,577 B1 | 8/2003 | Yamagami |
| 6,711,234 B1 | 3/2004 | Loxley et al. |
| 6,763,086 B2 | 7/2004 | Platonov |
| 6,829,327 B1 | 12/2004 | Chen |
| 6,891,627 B1 | 5/2005 | Levy et al. |
| 6,914,723 B2 | 7/2005 | Yun et al. |
| 6,934,359 B2 | 8/2005 | Chen |
| 7,006,596 B1 | 2/2006 | Janik |
| 7,023,955 B2 | 4/2006 | Chen et al. |
| 7,095,822 B1 | 8/2006 | Yun |
| 7,119,953 B2 | 10/2006 | Yun et al. |
| 7,120,228 B2 | 10/2006 | Yokhin et al. |
| 7,180,979 B2 | 2/2007 | Momose |
| 7,183,547 B2 | 2/2007 | Yun et al. |
| 7,187,751 B2 | 3/2007 | Kawahara et al. |
| 7,215,736 B1 | 5/2007 | Wang et al. |
| 7,218,703 B2 | 5/2007 | Yada et al. |
| 7,221,731 B2 | 5/2007 | Yada et al. |
| 7,245,696 B2 | 7/2007 | Yun et al. |
| 7,268,945 B2 | 9/2007 | Yun et al. |
| 7,388,942 B2 | 6/2008 | Wang et al. |
| 7,394,890 B1 | 7/2008 | Wang et al. |
| 7,400,704 B1 | 7/2008 | Yun et al. |
| 7,406,151 B1 | 7/2008 | Yun |
| 7,414,787 B2 | 8/2008 | Yun et al. |
| 7,463,712 B2 | 12/2008 | Zhu et al. |
| 7,486,770 B2 | 2/2009 | Baumann |
| 7,492,871 B2 | 2/2009 | Popescu |
| 7,499,521 B2 | 3/2009 | Wang et al. |
| 7,515,684 B2 | 4/2009 | Gibson et al. |
| 7,522,698 B2 | 4/2009 | Popescu |
| 7,522,708 B2 | 4/2009 | Heismann |
| 7,532,704 B2 | 5/2009 | Hempel |
| 7,551,719 B2 | 6/2009 | Yokhin et al. |
| 7,551,722 B2 | 6/2009 | Ohshima et al. |
| 7,561,662 B2 | 7/2009 | Wang et al. |
| 7,564,941 B2 | 7/2009 | Baumann |
| 7,639,786 B2 | 12/2009 | Baumann |
| 7,646,843 B2 | 1/2010 | Popescu et al. |
| 7,653,177 B2 | 1/2010 | Baumann et al. |
| 7,680,243 B2 | 3/2010 | Yokhin et al. |
| 7,787,588 B1 | 8/2010 | Yun et al. |
| 7,796,725 B1 | 9/2010 | Yun et al. |
| 7,796,726 B1 | 9/2010 | Gendreau et al. |
| 7,809,113 B2 | 10/2010 | Aoki et al. |
| 7,813,475 B1 | 10/2010 | Wu et al. |
| 7,817,777 B2 | 10/2010 | Baumann et al. |
| 7,848,483 B2 | 12/2010 | Platonov |
| 7,864,922 B2 | 1/2011 | Kawabe |
| 7,889,838 B2 | 2/2011 | David et al. |
| 7,899,154 B2 | 3/2011 | Chen et al. |
| 7,920,676 B2 | 4/2011 | Yun et al. |
| 7,924,973 B2 | 4/2011 | Kottler et al. |
| 7,945,018 B2 | 5/2011 | Heismann |
| 7,949,092 B2 | 5/2011 | Brons |
| 7,949,095 B2 | 5/2011 | Ning |
| 7,974,379 B1 | 7/2011 | Case et al. |
| 7,983,381 B2 | 7/2011 | David et al. |
| 8,005,185 B2 | 8/2011 | Popescu |
| 8,009,796 B2 | 8/2011 | Popescu |
| 8,009,797 B2 | 8/2011 | Ouchi |
| 8,041,004 B2 | 10/2011 | David |
| 8,058,621 B2 | 11/2011 | Kommareddy |
| 8,068,579 B1 | 11/2011 | Yun et al. |
| 8,073,099 B2 | 12/2011 | Niu et al. |
| 8,139,711 B2 | 3/2012 | Takahashi |
| 8,165,270 B2 | 4/2012 | David et al. |
| 8,184,771 B2 | 5/2012 | Murakoshi |
| 8,233,587 B2 | 7/2012 | Sato |
| 8,243,879 B2 | 8/2012 | Itoh et al. |
| 8,306,183 B2 | 11/2012 | Koehler |
| 8,351,570 B2 | 1/2013 | Nakamura |
| 8,353,628 B1 | 1/2013 | Yun et al. |
| 8,374,309 B2 | 2/2013 | Donath |
| 8,451,975 B2 | 5/2013 | Tada |
| 8,559,594 B2 | 10/2013 | Ouchi |
| 8,559,597 B2 | 10/2013 | Chen et al. |
| 8,565,371 B2 | 10/2013 | Bredno |
| 8,591,108 B2 | 11/2013 | Tada |
| 8,602,648 B1 | 12/2013 | Jacobsen et al. |
| 8,632,247 B2 | 1/2014 | Ishii |
| 8,755,487 B2 | 6/2014 | Kaneko |
| 8,767,915 B2 | 7/2014 | Stutman |
| 8,767,916 B2 | 7/2014 | Hashimoto |
| 8,781,069 B2 | 7/2014 | Murakoshi |
| 8,824,629 B2 | 9/2014 | Ishii |
| 8,855,265 B2 | 10/2014 | Engel |
| 8,859,977 B2 | 10/2014 | Kondoh |
| 8,908,824 B2 | 12/2014 | Kondoh |
| 8,972,191 B2 | 3/2015 | Stampanoni et al. |
| 8,989,474 B2 | 3/2015 | Kido et al. |
| 9,001,967 B2 | 4/2015 | Baturin |
| 9,016,943 B2 | 4/2015 | Jacobsen et al. |
| 9,025,725 B2 | 5/2015 | Kiyohara et al. |
| 9,031,201 B2 | 5/2015 | Sato |
| 9,036,773 B2 | 5/2015 | David et al. |
| 9,063,055 B2 | 6/2015 | Ouchi |
| 9,086,536 B2 | 7/2015 | Pang et al. |
| 9,129,715 B2 | 9/2015 | Adler et al. |
| 9,222,899 B2 | 12/2015 | Yamaguchi |
| 9,230,703 B2 | 1/2016 | Mohr et al. |
| 9,234,856 B2 | 1/2016 | Mukaide |
| 9,291,578 B2 | 3/2016 | Adler |
| 9,329,141 B2 | 5/2016 | Stutman |
| 9,357,975 B2 | 6/2016 | Baturin |
| 9,439,613 B2 | 9/2016 | Stutman |
| 9,448,190 B2 | 9/2016 | Yun et al. |
| 9,453,803 B2 | 9/2016 | Radicke |
| 9,480,447 B2 | 11/2016 | Mohr et al. |
| 9,486,175 B2 | 11/2016 | Fredenberg et al. |
| 9,494,534 B2 | 11/2016 | Baturin |
| 9,532,760 B2 | 1/2017 | Anton et al. |
| 9,551,677 B2 | 1/2017 | Mazor et al. |
| 9,557,280 B2 | 1/2017 | Pfeiffer et al. |
| 9,570,265 B1 | 2/2017 | Yun et al. |
| 9,588,066 B2 | 3/2017 | Pois et al. |
| 9,594,036 B2 | 3/2017 | Yun et al. |
| 9,632,040 B2 | 4/2017 | Stutman |
| 9,700,267 B2 | 7/2017 | Baturin et al. |
| 9,719,947 B2 | 8/2017 | Yun et al. |
| 9,748,012 B2 | 8/2017 | Yokoyama |
| 9,757,081 B2 | 9/2017 | Proksa |
| 9,761,021 B2 | 9/2017 | Koehler |
| 9,770,215 B2 | 9/2017 | Souchay et al. |
| 9,778,213 B2 | 10/2017 | Bakeman et al. |
| 9,823,203 B2 | 11/2017 | Yun et al. |

(56) References Cited

U.S. PATENT DOCUMENTS

| | | | |
|---|---|---|---|
| 9,826,949 B2 | 11/2017 | Ning | |
| 9,861,330 B2 | 1/2018 | Rossi | |
| 9,874,531 B2 | 1/2018 | Yun et al. | |
| 9,881,710 B2 | 1/2018 | Roessl | |
| 9,916,655 B2 | 3/2018 | Sampanoni | |
| 10,028,716 B2 | 7/2018 | Rossi | |
| 10,045,753 B2 | 8/2018 | Teshima | |
| 10,074,451 B2 | 9/2018 | Kottler et al. | |
| 10,076,297 B2 | 9/2018 | Bauer | |
| 10,085,701 B2 | 10/2018 | Hoshino | |
| 10,141,081 B2 | 11/2018 | Preusche | |
| 10,151,713 B2 | 12/2018 | Wu et al. | |
| 10,153,061 B2 | 12/2018 | Yokoyama | |
| 10,153,062 B2 | 12/2018 | Gall et al. | |
| 10,247,683 B2 | 4/2019 | Yun et al. | |
| 10,267,752 B2 | 4/2019 | Zhang et al. | |
| 10,267,753 B2 | 4/2019 | Zhang et al. | |
| 10,295,485 B2 | 5/2019 | Yun et al. | |
| 10,304,580 B2 | 5/2019 | Yun et al. | |
| 10,349,908 B2 | 7/2019 | Yun et al. | |
| 10,352,695 B2 | 7/2019 | Dziura et al. | |
| 10,352,880 B2 | 7/2019 | Yun et al. | |
| 10,401,309 B2 | 9/2019 | Yun et al. | |
| 10,416,099 B2 | 9/2019 | Yun et al. | |
| 10,466,185 B2 | 11/2019 | Yun et al. | |
| 10,473,598 B2 | 11/2019 | Ogata et al. | |
| 10,485,492 B2 | 11/2019 | Koehler et al. | |
| 10,514,345 B2 | 12/2019 | Ogata et al. | |
| 10,514,346 B2 | 12/2019 | Sako | |
| 10,568,588 B2 | 2/2020 | Koehler et al. | |
| 10,578,566 B2 | 3/2020 | Yun et al. | |
| 10,634,628 B2 | 4/2020 | Kasper et al. | |
| 10,653,376 B2 | 5/2020 | Yun et al. | |
| 10,697,902 B2 | 6/2020 | Sharma et al. | |
| 10,782,252 B2 | 9/2020 | Gateshki et al. | |
| 10,794,845 B2 | 10/2020 | Filsinger | |
| 10,895,541 B2 | 1/2021 | Shchegrov et al. | |
| 10,976,270 B2 | 4/2021 | Wormington | |
| 2001/0046276 A1* | 11/2001 | Schneider | G21K 7/00 378/58 |
| 2003/0142781 A1 | 7/2003 | Kawahara | |
| 2003/0223536 A1 | 12/2003 | Yun et al. | |
| 2004/0047446 A1 | 3/2004 | Platonov | |
| 2005/0282300 A1 | 12/2005 | Yun et al. | |
| 2006/0062350 A1 | 3/2006 | Yokhin | |
| 2006/0182322 A1 | 8/2006 | Bernhardt et al. | |
| 2007/0108387 A1 | 5/2007 | Yun et al. | |
| 2007/0183563 A1 | 8/2007 | Baumann | |
| 2007/0183579 A1 | 8/2007 | Baumann et al. | |
| 2007/0189449 A1 | 8/2007 | Baumann | |
| 2007/0248215 A1 | 10/2007 | Ohshima et al. | |
| 2008/0084966 A1 | 4/2008 | Aoki et al. | |
| 2008/0159475 A1 | 7/2008 | Mazor et al. | |
| 2008/0170662 A1 | 7/2008 | Reinhold | |
| 2008/0181363 A1 | 7/2008 | Fenter et al. | |
| 2008/0273662 A1 | 11/2008 | Yun | |
| 2009/0052619 A1 | 2/2009 | Endoh | |
| 2009/0092227 A1 | 4/2009 | David | |
| 2009/0154640 A1 | 6/2009 | Baumann et al. | |
| 2009/0316857 A1 | 12/2009 | David et al. | |
| 2010/0061508 A1 | 3/2010 | Takahashi | |
| 2010/0091947 A1 | 4/2010 | Niu | |
| 2010/0246765 A1 | 9/2010 | Murakoshi | |
| 2010/0260315 A1 | 10/2010 | Sato et al. | |
| 2010/0284513 A1 | 11/2010 | Kawabe | |
| 2011/0243302 A1 | 10/2011 | Murakoshi | |
| 2011/0268252 A1 | 11/2011 | Ozawa et al. | |
| 2012/0041679 A1 | 2/2012 | Stampanoni | |
| 2012/0224670 A1 | 9/2012 | Kiyohara et al. | |
| 2012/0228475 A1 | 9/2012 | Pang et al. | |
| 2013/0011040 A1 | 1/2013 | Kido et al. | |
| 2013/0039460 A1 | 2/2013 | Levy | |
| 2013/0108012 A1 | 5/2013 | Sato | |
| 2013/0108022 A1 | 5/2013 | Kugland et al. | |
| 2013/0251100 A1 | 9/2013 | Sasaki et al. | |
| 2013/0308112 A1 | 11/2013 | Clube et al. | |
| 2014/0023973 A1 | 1/2014 | Marconi et al. | |
| 2014/0037052 A1 | 2/2014 | Adler | |
| 2014/0064445 A1 | 3/2014 | Adler | |
| 2014/0072104 A1 | 3/2014 | Jacobsen et al. | |
| 2014/0105353 A1 | 4/2014 | Pfeiffer et al. | |
| 2014/0105363 A1 | 4/2014 | Chen et al. | |
| 2014/0146945 A1 | 5/2014 | Fredenberg et al. | |
| 2014/0153692 A1 | 6/2014 | Larkin et al. | |
| 2014/0205057 A1 | 7/2014 | Koehler et al. | |
| 2014/0226785 A1 | 8/2014 | Stutman et al. | |
| 2014/0270060 A1 | 9/2014 | Date et al. | |
| 2015/0030126 A1 | 1/2015 | Radicke | |
| 2015/0043713 A1 | 2/2015 | Chen | |
| 2015/0049860 A1 | 2/2015 | Das | |
| 2015/0051877 A1 | 2/2015 | Bakeman et al. | |
| 2015/0055743 A1 | 2/2015 | Vedantham et al. | |
| 2015/0055745 A1 | 2/2015 | Holzner et al. | |
| 2015/0071402 A1 | 3/2015 | Handa | |
| 2015/0117599 A1 | 4/2015 | Yun et al. | |
| 2015/0243397 A1 | 8/2015 | Yun et al. | |
| 2015/0247811 A1 | 9/2015 | Yun et al. | |
| 2015/0260663 A1 | 9/2015 | Yun et al. | |
| 2015/0270023 A1* | 9/2015 | Adler | G01N 23/04 378/43 |
| 2015/0323478 A1 | 11/2015 | Stutman | |
| 2015/0357069 A1 | 12/2015 | Yun et al. | |
| 2016/0066870 A1* | 3/2016 | Yun | A61B 6/4007 378/21 |
| 2016/0178541 A1 | 6/2016 | Hwang et al. | |
| 2016/0206259 A1 | 7/2016 | Auclair et al. | |
| 2017/0047191 A1 | 2/2017 | Yun et al. | |
| 2017/0162288 A1 | 6/2017 | Yun et al. | |
| 2017/0227476 A1 | 8/2017 | Zhang et al. | |
| 2017/0234811 A1 | 8/2017 | Zhang et al. | |
| 2017/0261442 A1 | 9/2017 | Yun et al. | |
| 2017/0336334 A1 | 11/2017 | Yun et al. | |
| 2018/0182131 A1 | 6/2018 | Koehler et al. | |
| 2018/0202951 A1 | 7/2018 | Yun et al. | |
| 2018/0261352 A1 | 9/2018 | Matsuyama et al. | |
| 2018/0306734 A1 | 10/2018 | Morimoto et al. | |
| 2018/0323032 A1 | 11/2018 | Strelec et al. | |
| 2018/0348151 A1 | 12/2018 | Kasper et al. | |
| 2019/0017946 A1 | 1/2019 | Wack et al. | |
| 2019/0027265 A1 | 1/2019 | Dey et al. | |
| 2019/0064084 A1 | 2/2019 | Ullom et al. | |
| 2019/0086342 A1 | 3/2019 | Pois et al. | |
| 2019/0115184 A1 | 4/2019 | Zalubovsky | |
| 2019/0172681 A1 | 6/2019 | Owen et al. | |
| 2019/0204757 A1 | 7/2019 | Brussard et al. | |
| 2019/0206652 A1 | 7/2019 | Akinwande et al. | |
| 2019/0212281 A1 | 7/2019 | Shchgegrov | |
| 2019/0216416 A1 | 7/2019 | Koehler et al. | |
| 2019/0219713 A1 | 7/2019 | Booker et al. | |
| 2019/0261935 A1 | 8/2019 | Kitamura | |
| 2019/0317027 A1 | 10/2019 | Tsuboi et al. | |
| 2019/0331616 A1 | 10/2019 | Schaff et al. | |
| 2019/0391087 A1 | 12/2019 | Matejka et al. | |
| 2020/0003712 A1 | 1/2020 | Kataoka et al. | |
| 2020/0041429 A1 | 2/2020 | Cho et al. | |
| 2020/0088656 A1 | 3/2020 | Pois et al. | |
| 2020/0090826 A1 | 3/2020 | Adler | |
| 2020/0103358 A1 | 4/2020 | Wiell et al. | |
| 2020/0155088 A1 | 5/2020 | Gruener et al. | |
| 2020/0158662 A1 | 5/2020 | Horiba et al. | |
| 2020/0182806 A1 | 6/2020 | Kappler et al. | |
| 2020/0225172 A1 | 7/2020 | Sato et al. | |
| 2020/0225173 A1 | 7/2020 | Sato et al. | |
| 2020/0225371 A1 | 7/2020 | Greenberg et al. | |
| 2020/0232937 A1 | 7/2020 | Yaroshenko et al. | |
| 2020/0279351 A1 | 9/2020 | Ratner et al. | |
| 2020/0292475 A1 | 9/2020 | Cao et al. | |
| 2020/0300789 A1 | 9/2020 | Osakabe et al. | |
| 2020/0300790 A1 | 9/2020 | Gellineau et al. | |
| 2020/0303265 A1 | 9/2020 | Gellineau et al. | |
| 2020/0319120 A1 | 10/2020 | Kitamura et al. | |

(56) References Cited

U.S. PATENT DOCUMENTS

| | | | |
|---|---|---|---|
| 2020/0337659 | A1 | 10/2020 | Sano et al. |
| 2020/0378905 | A1 | 12/2020 | Safai |
| 2020/0378908 | A1 | 12/2020 | Fujimura et al. |

FOREIGN PATENT DOCUMENTS

| | | | |
|---|---|---|---|
| CN | 102325498 | B | 1/2012 |
| CN | 102551761 | A | 7/2012 |
| EP | 0751533 | | 1/1997 |
| EP | 1169713 | | 1/2006 |
| JP | H06-188092 | | 7/1994 |
| JP | H07-194592 | | 8/1995 |
| JP | H08-128971 | | 5/1996 |
| JP | H08-184572 | | 7/1996 |
| JP | H11-304728 | | 11/1999 |
| JP | H11-352079 | | 12/1999 |
| JP | 2001-021507 | | 1/2001 |
| JP | 2003-149392 | | 5/2003 |
| JP | 2007-218683 | | 8/2007 |
| JP | 2008-200359 | | 4/2008 |
| JP | 2008-145111 | | 6/2008 |
| JP | 2008-197495 | | 8/2008 |
| JP | 2009-195349 | | 3/2009 |
| JP | 2010-236986 | | 10/2010 |
| JP | 2011-033537 | | 2/2011 |
| JP | 2011-218147 | | 11/2011 |
| JP | 2012-032387 | | 2/2012 |
| JP | 2012-187341 | | 10/2012 |
| JP | 2012-254294 | | 12/2012 |
| JP | 2013-508683 | | 3/2013 |
| JP | 2015-529984 | | 7/2013 |
| JP | 2013-181811 | | 9/2013 |
| JP | 2015-047306 | | 3/2015 |
| JP | 2015-072263 | | 4/2015 |
| JP | 2015-077289 | | 4/2015 |
| JP | 2017-040618 | | 2/2017 |
| KR | 10-2012-0091591 | A | 8/2012 |
| KR | 10-2014-0059688 | | 5/2014 |
| WO | WO 2007/125833 | | 11/2007 |
| WO | WO 2008/068044 | | 6/2008 |
| WO | WO 2009/104560 | | 8/2009 |
| WO | WO 2011/032572 | | 3/2011 |
| WO | WO 2012/032950 | | 3/2012 |
| WO | WO 2013/004574 | | 1/2013 |
| WO | WO 2013/111050 | | 8/2013 |
| WO | WO 2013/160153 | | 10/2013 |
| WO | WO 2015/066333 | | 5/2015 |
| WO | WO 2015/168473 | | 11/2015 |
| WO | WO 2015/176023 | | 11/2015 |
| WO | WO 2015/187219 | | 12/2015 |
| WO | WO 2016/187623 | | 11/2016 |
| WO | WO 2017/031740 | | 3/2017 |
| WO | WO 2017/213996 | | 12/2017 |
| WO | WO 2018/122213 | | 7/2018 |
| WO | WO 2018/175570 | | 9/2018 |

OTHER PUBLICATIONS

Altapova et al., "Phase contrast laminography based on Talbot interferometry," Opt. Express, vol. 20, No. 6, (2012) pp. 6496-6508.
Bachucki et al., "Laboratory-based double X-ray spectrometer for simultaneous X-ray emission and X-ray absorption studies," J. Anal. Atomic Spectr. DOI:10.1039/C9JA00159J (2019).
Baron et al., "A compact optical design for Bragg reflections near backscattering," J. Synchrotron Rad., vol. 8 (2001), pp. 1127-1130.
Bech, "X-ray imaging with a grating interferometer," University of Copenhagen PhD. Thesis, (May 1, 2009).
Bech, "In-vivo dark-field and phase-contrast x-ray imaging," Scientific Reports 3, (2013), Article No. 03209.
Birkholz, "Chapter 4: Grazing Incidence Configurations," Thin Film Analysis by X-ray Scattering (Wiley-VCH Verlag GmbH & Co. KGaA, Weinheim, Germany, 2006).

Buchanan et al., "Effective modelling of high-energy laboratory-based x-ray phase contrast imaging utilising absorption masks or gratings," J. Appl. Physics (accepted) (2020).
Chen et al., "Advance in detection of low sulfur content by wavelength dispersive XRF," Proceedings of the Annual ISA Analysis Division Symposium (2002).
Coan et al., "In vivo x-ray phase contrast analyzer-based imaging for longitudinal osteoarthritis studies in guinea pigs," Phys. Med. Biol, vol. 55(24) (2010), pp. 7649-7662.
Cohen et al., "Tunable laboratory extended x-ray absorption fine structure system," Rev. Sci. Instr. vol. 51, No. 3, Mar. 1980, pp. 273-277.
David et al., "Hard X-ray phase imaging and tomography using a grating interferometer," Spectrochimica Acta Part B vol. 62 (2007) pp. 626-630.
Davis et al., "Bridging the Micro-to-Macro Gap: A New Application for Micro X-Ray Fluorescence," Microsc Microanal., vol. 17(3) (Jun. 2011), pp. 410-417.
Diaz et al., "Monte Carlo Simulation of Scatter Field for Calculation of Contrast of Discs in Synthetic CDMAM Images," In: Digital Mammography, Proceedings 10th International Workshop IWDM 2010 (Springer Verlag, Berlin Heidelberg), (2010), pp. 628-635 (9 pages).
Dittler et al., "A mail-in and user facility for X-ray absorption near-edge structure: the CEI-XANES laboratory X-ray spectrometer at University of Washington," J. Synch. Rad. vol. 26, eight pages, (2019).
Dong et al., "Improving Molecular Sensitivity in X-Ray Fluorescence Molecular Imaging (XFMI) of Iodine Distribution in Mouse-Sized Phantoms via Excitation Spectrum Optimization," IEEE Access, vol. 6, pp. 56966-56976 (2018).
Erko et al., "X-ray Optics," Ch. 3 of "Handbook of Practical X-Ray Fluorescence Analysis," B. Beckhoff et al., eds. (Springer, Berlin, Germany, 2006), pp. 85-198.
Fernández-Ruiz, "TXRF Spectrometry as a Powerful Tool for the Study of Metallic Traces in Biological Systems," Development in Analytical Chemistry, vol. 1 (2014), pp. 1-14.
Ge et al., "Investigation of the partially coherent effects in a 2D Talbot interferometer," Anal. Bioanal. Chem, vol. 401, (2011), pp. 865-870.
Graelz et al., "Lenseless C-ray Nano-Tomography down to 150 nm Resolution: On the Quantification of Modulation Transfer and Focal Spot of the Lab-based ntCT System," arXiv:2009.11749v1 [physics.ins-det] Sep. 24, 2020, 10 pages.
Günther et al., "Full-field structured-illumination super-resolution X-ray transmission microscopy," Nature Comm. 10:2494 (2019) and supplementary information.
Harasse et al., "X-ray Phase Laminography with Talbot Interferometer", in Developments in X-Ray Tomography VII, Proc. SPIE vol. 7804 (2010), 780411.
Harasse et al., "Iterative reconstruction in x-ray computed laminography from differential phase measurements", Opt. Express, vol. 19 (2011), pp. 16560-16573.
Harasse et al., "X-ray Phase Laminography with a Grating Interferometer using Iterative Reconstruction", in International Workshop on X-ray and Neutron Phase Imaging with Gratings, AIP Conf. Proc, vol. 1466, (2012), pp. 163-168.
Hashimoto et al., "Improved reconstruction method for phase stepping data with stepping errors and dose fluctuations," Optics Express, vol. 28, No. 11, pp. 16363-16384 (2020).
Hemraj-Benny et al., "Near-Edge X-ray Absorption Fine Structure Spectroscopy as a Tool for Investigating Nanomaterials," Small, vol. 2(1), (2006), pp. 26-35.
Hennekam et al., "Trace metal analysis of sediment cores using a novel X-ray fluorescence core scanning method," Quaternary Int'l, https://doi.org/10.1016/j.quaint.2018.10.018 (2018).
Honma et al., Full-automatic XAFS Measurement System of the Engineering Science Research II beamline BL14B2 at Spring-8, 2011, AIP Conference Proceedings 1234, pp. 13-16.
Howard et al., "High-Definition X-ray Fluorescence Elemental Mapping of Paintings," Anal. Chem., 2012, vol. 84(7), pp. 3278-3286.

(56) References Cited

OTHER PUBLICATIONS

Ide-Ektessabi et al., "The role of trace metallic elements in neurodegenerative disorders: quantitative analysis using XRF and XANES spectroscopy," Anal. Sci., vol. 21 (7) (Jul. 2005), pp. 885-892.
Ishisaka et al., "A New Method of Analyzing Edge Effect in Phase Contrast Imaging with Incoherent X-rays," Optical Review, vol. 7, No. 6, (2000), pp. 566-572.
Ito et al., "A Stable In-Laboratory EXAFS Measurement System," Jap. J. Appl. Phys., vol. 22, No. 2, Feb. 1, 1983, pp. 357-360.
Itoh et al., "Two-dimensional grating-based X-ray phase-contrast imaging using Fourier transform phase retrieval," Op. Express, vol. 19, No. 4 (2011) pp. 3339-3346.
Janssens et al., "Recent trends in quantitative aspects of microscopic X-ray fluorescence analysis," TrAC Trends in Analytical Chemistry 29.6 (Jun. 2010): 464-478.
Jahrman et al., "Vacuum formed temporary spherically and toroidally bent crystal analyzers for x-ray absorption and x-ray emission spectroscopy," Rev. Sci. Inst. vol. 90, 013106 (2019).
Jiang et al., "X-Ray Phase-Contrast Imaging with Three 2D Gratings," Int. J. Biomed. Imaging, (2008), 827152, 8 pages.
Kalasová et al., "Characterization of a laboratory-based X-ray computed nanotomography system for propagation-based method of phase contrast imaging," IEEE Trans. On Instr. And Meas., DOI 10.1109/TIM.2019.2910338 (2019).
Keyrilainen et al., "Phase contrast X-ray imaging of breast," Acta Radiologica, vol. 51 (8), (2010), pp. 866-884.
Kido et al., "Bone Cartilage Imaging with X-ray Interferometry using a Practical X-ray Tube", in Medical Imaging 2010: Physics of Medical Imaging, Proc. SPIE vol. 7622 (2010), 762240.
Kim, "Talbot images of wavelength-scale amplitude gratings," Opt. Express vol. 20(5), (2012), pp. 4904-4920.
Kim et al., "Observation of the Talbot Effect at Beamline 6C Bio Medical Imaging of the Pohang Light Source—II," J. Korean Phys. Soc., vol. 74, No. 10, pp. 935-940 (May 2019).
Kim et al., "A Simulation Study on the Transfer Characteristics of the Talbot Pattern Through Scintillation Screens in the Grating Interferometer," J. Rad. Sci. and Tech. 42(1), pp. 67-75 (2019).
Kiyohara et al., "Development of the Talbot-Lau Interferometry System Available for Clinical Use", in International Workshop on X-ray and Neutron Phase Imaging with Gratings, AIP Cong. Proc. vol. 1466, (2012), pp. 97-102.
Klockenkämper et al., "7.1 Instrumental Developments" and "7.3 Future Prospects by Combinations," from Chapter 7 of Total Reflection X-ray Fluorescence Analysis and Related Methods 2nd Ed. (J. Wiley and Sons, Hoboken, NJ, 2015).
Klockenkämper et al., "Chapter 3: Instrumentation for TXRF and GI-XRF," Total Reflection X-ray Fluorescence Analysis and Related Methods 2nd Ed. (J. Wiley and Sons, Hoboken, NJ, 2015).
Kottler et al., "A two-directional approach for grating based differential phase contrast imaging using hard x-rays," Opt. Express vol. 15(3), (2007), pp. 1175-1181.
Kottler et al., "Dual energy phase contrast x-ray imaging with Talbot-Lau interferometer," J. Appl. Phys, vol. 108(11), (2010), 114906.
Kulow et al., "On the Way to Full-Field X-ray Fluorescence Spectroscopy Imaging with Coded Apertures," J. Anal. At. Spectrom. Doi: 10.1039/C9JA00232D (2019).
Kuwabara et al., "Hard-X-ray Phase-Difference Microscopy with a Low-Brilliance Laboratory X-ray Source", Appl. Phys. Express vol. 4 (2011) 062502.
Li et al., "X-ray phase-contrast imaging using cascade Talbot-Lau interferometers," Proc. SPIE 10964 (2018), pp. 1096469-1-1096469-6.
Lohmann et al., "An interferometer based on the Talbot effect," Optics Communications vol. 2(1971), pp. 413-415.
Lübcke et al., "Soft X-ray nanoscale imaging using a sub-pixel resolution charge coupled device (CCD) camera," Rev. Sci. Instrum. vol. 90, 043111 (2019).
Lühl et al., "Scanning transmission X-ray microscopy with efficient X-ray fluorescence detection (STXM-XRF) for biomedical applications in the soft and tender energy range," J. Synch. Rad. vol. 26, https://doi.org/10.1107/S1600577518016879 , (2019).
Malzer et al., "A laboratory spectrometer for high throughput X-ray emission spectroscopy in catalysis research," Rev. Sci. Inst. 89, 113111 (2018).
Mamyrbayev et al., "Staircase array of inclined refractive multilenses for large field of view pixel super-resolution scanning transmission hard X-ray microscopy," J. Synch. Rad., vol. 28 https://doi.org/10.1107/S1600577521001521 (2021).
Matsuyama et al., "Wavefront measurement for a hard-X-ray nanobeam using single-grating interferometry", Opt Express vol. 20 (2012), pp. 24977-24986.
Miao et al., "Motionless phase stepping in X-ray phase contrast imaging with a compact source," Proceedings of the National Academy of Sciences, vol. 110(48), (2013), pp. 19268-19272.
Mijovilovich et al., "Analysis of trace metal distribution in plants with lab-based microscopic X-ray fluorescence imaging," Plant Methods, vol. 16, No. 82, 21 pages (2020).
Mizutani et al., X-ray microscopy for neural circuit reconstruction in 9th International Conference on X-Ray Microscopy, J. Phys: Conf. Ser. 186 (2009) 012092.
Modregger et al., "Grating-Based X-ray Phase Contrast Imaging," Ch. 3 of Emerging Imaging Technologies in Medicine, M. Anastasio & P. La Riviere, ed., CRC Press, Boca Raton, FL, (2012), pp. 43-56.
Momose et al., "Phase-Contrast X-Ray Imaging Using an X-Ray Interferometer for Biological Imaging", Analytical Sciences vol. 17 Supplement (2001), pp. 1527-1530.
Momose et al.,"Demonstration of X-Ray Talbot Interferometry", Jpn. J. Appl. Phys. vol. 42 (2003), pp. L866-L868.
Momose et al., "Phase Tomography Using an X-ray Talbot Interferometer", in Developments in X-Ray Tomography IV, Proc. SPIE vol. 5535 (2004), pp. 352-360.
Momose, "Recent Advances in X-ray Phase Imaging", Jpn. J. Appl. Phys. vol. 44 (2005), pp. 6355-6367.
Momose et al., "Biomedical Imaging by Talbot-Type X-Ray Phase Tomography" in Developments in X-Ray Tomography V, Proc. SPIE vol. 6318 (2006) 63180T.
Momose et al., "Phase Tomography by X-ray Talbot Interferometry for Biological Imaging" Jpn. J. Appl. Phys. vol. 45 2006 pp. 5254-5262.
Momose et al., "X-ray Talbot Interferometry with Capillary Plates", Jpn. J. Appl. Phys. vol. 45 (2006), pp. 314-316.
Momose et al., "Phase Imaging with an X-ray Talbot Interferometer", Advances in X-ray Analysis vol. 49(3) (2006), pp. 21-30.
Momose et al., "Phase Tomography Using X-ray Talbot Interferometer", in Synchrotron Radiation Instrumentation: Ninth International Conference, AIP Conf. Proc. vol. 879 (2007), pp. 1365-1368.
Momose et al., "Sensitivity of X-ray Phase Imaging Based on Talbot Interferometry", Jpn. J. Appl. Phys, vol. 47 (2008), pp. 8077-8080.
Momose et al., "Grating-Based X-ray Phase Imaging Using Multiline X-ray Source", Jpn. J. Appl. Phys. vol. 48 (2009), 076512.
Momose et al., "X-ray phase tomography with a Talbot interferometer in combination with an X-ray imaging microscope", in 9th International Conference on X-Ray Microscopy, J. Phys: Conf. Ser. 186 (2009) 012044.
Momose et al., "High-speed X-ray phase imaging and X-ray phase tomography with Talbot interferometer and white synchrotron radiation", Opt. Express vol. 17 (2009), pp. 12540-12545.
Momose et al., "X-Ray Phase Imaging with Talbot Interferometry", in "Biomedical Mathematics: Promising Directions in Imaging, Therapy Planning, and Inverse Problems", Y. Censor, M. Jiang & G.Wang, eds. (Medical Physics Publishing, Madison, WI, USA, 2010), pp. 281-320.
Momose et al., "X-ray Phase Measurements with Talbot Interferometry and Its Applications", in International Conference on Advanced Phase Measurement Methods in Optics and Imaging, AIP Conf. Proc, vol. 1236 (2010), pp. 195-199.
Momose et al., "X-ray Phase Imaging Using Lau Effect", Appl. Phys. Express vol. 4 (2011) 066603.

(56) References Cited

OTHER PUBLICATIONS

Momose et al., "Four-dimensional X-ray phase tomography with Talbot interferometry and white synchrotron radiation: dynamic observation of a living worm", Opt. Express vol. 19 (2011), pp. 8423-8432.
Momose et al., "X-ray Phase Imaging—From Static Observation to Dynamic Observation—", in International Workshop on X-ray and Neutron Phase Imaging with Gratings AIP Conf. Proc, vol. 1466, (2012), pp. 67-77.
Momose et al., "Recent Progress in X-ray and Neutron Phase Imaging with Gratings," Quantum Beam Science, vol. 4, No. 9; doi:10.3390/qubs4010009 (2020).
Morimoto et al., "X-ray phase contrast imaging by compact Talbot-Lau interferometer with a signal transmission grating," 2014, Optics Letters, vol. 39, No. 15, pp. 4297-4300.
Morimoto et al., "Design and demonstration of phase gratings for 2D single grating interferometer," Optics Express vol. 23, No. 23, 29399 (2015).
Munro et al., Design of a novel phase contrast imaging system for mammography, 2010, Physics in Medicine and Biology, vol. 55, No. 14, pp. 4169-4185.
Nango et al., "Talbot-defocus multiscan tomography using the synchrotron X-ray microscope to study the lacuno-canalicular network in mouse bone", Biomed. Opt. Express vol. 4 (2013), pp. 917-923.
Neuhausler et al., "Non-destructive high-resolution X-ray imaging of ULSI micro-electronics using keV X-ray microscopy in Zernike phase contrast," Microelectronic Engineering, Elsevier Publishers BV., Amsterdam, NO, vol. 83, No. 4-9 (Apr. 1, 2006) pp. 1043-1046.
Newville, "Fundamentals of XAFS," (Univ. of Chicago, Chicago, IL, Jul. 23, 2004).
Nykanen et al., "X-ray scattering in full-field digital mammography," Med. Phys. vol. 30(7), (2003), pp. 1864-1873.
Oji et al., Automatic XAFS measurement system developed at BL14B2 in SPring-8, Available online Nov. 15, 2011, Journal of Synchrotron Radiation, vol. 19, pp. 54-59.
Olbinado et al., "Demonstration of Stroboscopic X-ray Talbot Interferometry Using Polychromatic Synchrotron and Laboratory X-ray Sources", Appl. Phys. Express vol. 6 (2013), 096601.
Ortega et al., "Bio-metals imaging and speciation in cells using proton and synchrotron radiation X-ray microspectroscopy," J. Royal Society Interface vol. 6 suppl. 5 (Oct. 6, 2009), pp. 6S649-6S658.
Pandeshwar et al., "Modeling of beam hardening effects in a dual-phase X-ray grading interferometer for quantitative dark-field imaging," Optics Express, vol. 28, No. 13, Jun. 22, 2020, pp. 19187-19204 (2020).
Parrill et al., "GISAXS—Glancing Incidence Small Angle X-ray Scattering," Journal de Physique IV, vol. 3 (Dec. 1993), pp. 411-417.
Paunesku et al., "X-Ray Fluorescence Microprobe Imaging in Biology and Medicine," J. Cell. Biochem. vol. 99, pp. 1489-1502 (2006).
Pfeiffer et al., "Phase retrieval and differential phase-contrast imaging with low-brilliance X-ray sources," Nature Physics vol. 2, (2006), pp. 258-261.
Pfeiffer et al., "Hard x-ray phase tomography with low brilliance x-ray sources," Phys. Rev. Lett, vol. 98, (2007), 108105.
Pfeiffer et al.,"Hard-X-ray dark-field imaging using a grating interferometer," Nature Materials vol. 7, (2008), pp. 134-137.
Pfeiffer, "Milestones and basic principles of grating-based x-ray and neutron phase-contrast imaging," in International Workshop on X-ray and Neutron Phase Imaging with Gratings AIP Conf. Proc. vol. 1466, (2012), pp. 2-11.
Pianetta et al., "Application of synchrotron radiation to TXRF analysis of metal contamination on silicon wafer surfaces," Thin Solid Films, vol. 373(1-2), 2000, pp. 222-226.

Potts, "Electron Probe Microanalysis", Ch. 10 of "A Handbook of Silicate Rock Analysis" (Springer Science + Business Media, New York, 1987), pp. 326-382 (equation quoted from p. 336).
Prewitt et al., "Focused ion beam repair: staining of photomasks and reticles," J. Phys. D Appl. Phys. vol. 26 (1993), pp. 1135-1137.
Prewitt et al., "Gallium Staining in FIB Repair of Photomasks," Microelectronic Engineering, vol. 21 (1993), pp. 191-196.
Prewitt et al., "FIB Repair of 5X Reticles and Effects on IC Quality," Integrated Circuit Metrology, Inspection, and Process Control VII, Proc. SPIE vol. 1926 (1993), pp. 517-526.
Pushie et al., "Prion protein expression level alters regional copper, iron and zinc content in the mouse brain," Metallomics vol. 3, 206-214 (2011).
Pushie et al., "Elemental and Chemically Specific X-ray Fluorescence Imaging of Biological Systems," Chem. Rev. 114:17, 8499-8541 (2014).
Qin et al., "Trace metal imaging with high spatial resolution: Applications in biomedicine," Metallomics, vol. 3 (Jan. 2011), pp. 28-37.
Redus et al., "Spectrometer configuration and measurement uncertainty in X-ray spectroscopy," X-Ray Spectrom., pp. 1-14 (2020).
Renaud et al., "Probing surface and interface morphology with Grazing Incidence Small Angle X-ray Scattering," Surface Science Reports, vol. 64:8 (2009), pp. 255-380.
Rix et al., "Super-Resolution X-ray phase-contrast and dark-field imaging with a single 2D grating and electromagnetic source stepping," Phys. Med. Biol. In press https://doi.org/10.1088/1361-6560/ab2ff5 (2019).
Rutishauser, "X-ray grating interferometry for imaging and metrology," 2003, Eth Zurich, Diss. ETH No. 20939.
Sato et al., Two-dimensional gratings-based phase-contrast imaging using a conventional x-ray tube, 2011, Optics Letters, vol. 36, No. 18, pp. 3551-3553.
Scherer et al., "Bi-Directional X-Ray Phase-Contrast Mammography," PLoS ONE, vol. 9, Issue 5 (May 2014) e93502.
Scholze et al., "X-ray Detectors and XRF Detection Channels," Ch. 4 of "Handbook of Practical X-Ray Fluorescence Analysis," B. Beckhoff et al., eds. (Springer, Berlin Heidelberg, Germany, 2006), pp. 85-198.
Schunck et al., "Soft x-ray imaging spectroscopy with micrometer resolution," Optica vol. 8, No. 2, pp. 156-160 (2021).
Seifert et al., "Talbot-Lau x-ray phase-contrast setup for fast scanning of large samples," Sci. Rep. 9:4199, pp. 1-11 (2019).
Shimura et al., "Hard x-ray phase contrast imaging using a tabletop Talbot-Lau interferometer with multiline embedded x-ray targets", Opt. Lett. vol. 38(2) (2013), pp. 157-159.
Sparks Jr., "X-ray Fluorescence Microprobe for Chemical Analysis," in Synchrotron Radiation Research, H. Winick & S. Doniach, eds. (Plenum Press, New York, NY 1980), pp. 459-512.
Stampanoni et al., "The First Analysis and Clinical Evaluation of Native Breast Tissue Using Differential Phase-Contrast Mammography," Investigative Radiology, vol. 46, pp. 801-806. pub 2011-12-xx.
Sunday et al., "X-ray Metrology for the Semiconductor Industry Tutorial," J. Res. Nat'l Inst. Stan. vol. 124: 124003 (2019); https://doi.org/10.6028/jres.124.003.
Takeda et al., "X-Ray Phase Imaging with Single Phase Grating", Jpn. J. Appl. Phys. vol. 46 (2007), pp. L89-L91.
Takeda et al., "Differential Phase X-ray Imaging Microscopy with X-ray Talbot Interferometer" Appl. Phys. Express vol. 1 (2008) 117002.
Talbot, "Facts relating to optical science No. IV," Philos. Mag. vol. 9 (1836), pp. 401-407.
Tanaka et al., "Cadaveric and in vivo human joint imaging based on differential phase contrast by X-ray Talbot-Lau interferometry", Z. Med. Phys. vol. 23 (2013), pp. 222-227.
Taphorn et al., "Grating-based spectral X-ray dark-field imaging for correlation with structural size measures," Sci. Reports, vol. 10, 13195 (2020).
Terzano et al., Recent advances in analysis of trace elements in environmental samples by X-ray based techniques (IUPAC Technical Report), Pure Appl. Chem. 2019.

(56) References Cited

OTHER PUBLICATIONS

Tkachuk et al., "High-resolution x-ray tomography using laboratory sources", in Developments in X-Ray Tomography V, Proc. SPIE 6318 (2006): 631810.
Tkachuk et al., "Multi-length scale x-ray tomography using laboratory and synchrotron sources", Microsc. Microanal. vol. 13 (Suppl. 2) (2007), pp. 1570-1571.
Töpperwien et al., "Multiscale x-ray phase-contrast tomography in a mouse model of transient focal cerebral ischemia," Biomed. Op. Express, vol. 10, No. 1, Jan. 2019, pp. 92-103.
Tsuji et al., "X-Ray Spectrometry: Recent Technological Advances," John Wiley & Sons Ltd. Chichester, West Susses, UK 2004), Chapters 1-7.
Udagawa, "An Introduction to In-House EXAFS Facilities," The Rigaku Journal, vol. 6, (1) (1989), pp. 20-27.
Udagawa, "An Introduction to X-ray Absorption Fine Structure," The Rigaku Journal, vol. 11(2)(1994), pp. 30-39.
Uehara et al., "Effectiveness of X-ray grating interferometry for non-destructive inspection of packaged devices", J. Appl. Phys, vol. 114 (2013), 134901.
Viermetz et al., "High resolution laboratory grating-based X-ray phase-contrast CT," Scientific Reports 8:15884 (2018).
Vila-Comamala et al., "High sensitivity X-ray phase contrast imaging by laboratory grating-based interferometry at high Talbot order geometry," Op. Express vol. 29, No. 2, pp. 2049-2064 (2021).
Vogt, "X-ray Fluorescence Microscopy: A Tool for Biology, Life Science and Nanomedicine," Presentation on May 16, 2012 at James Madison Univ., Harrisonburg, VA (31 slides), 2012.
Wan et al.."Fabrication of Multiple Slit Using Stacked-Sliced Method for Hard X-ray Talbot-Lau Interferometer", Jpn. J. Appl. Phys, vol. 47 (2008), pp. 7412-7414.
Wang et al., "Advantages of intermediate X-ray energies in Zernike phase contrast X-ray microscopy," Biotech. Adv., vol. 31 (2013) pp. 387-392.
Weitkamp et al., "Hard X-ray phase imaging and tomography with a grating interferometer," Proc. SPIE vol. 5535, (2004), pp. 137-142.
Weitkamp et al., "X-ray phase imaging with a grating interferometer," Opt. Express vol. 13(16), (2005), pp. 6296-6304.
Weitkamp et al., "X-ray wavefront analysis and optics characterization with a grating interferometer," Appl. Phys. Lett, vol. 86, (2005), 054101.
Weitkamp et al., Tomography with grating interferometers at low-brilliance sources, 2006, SPIE, vol. 6318, pp. 0S-1 to 0S-10.
Weitkamp et al., "X-ray wavefront diagnostics with Talbot interferometers," International Workshop on X-Ray Diagnostics and Scientific Application of the European XFEL, Ryn, Poland, (2010), 36 slides.
Weitkamp et al., "Design aspects of X-ray grating interferometry," in International Workshop on X-ray and Neutron Phase Imaging with Gratings AIP Conf. Proc. vol. 1466, (2012), pp. 84-89.
Wen et al., "Fourier X-ray Scattering Radiography Yields Bone Structural Information," Radiology, vol. 251 (2009) pp. 910-918.
Wen et al., "Single-shot x-ray differential phase-contrast and diffraction imaging using two-dimensional transmission gratings," Op. Lett. vol. 35, No. 12, (2010) pp. 1932-1934.
Wilde et al., "Modeling of an X-ray grating-based imaging interferometer using ray tracing," Op. Express vol. 28, No. 17, p. 24657 (2020).
Withers et al., "X-ray computed tomography," Nature Reviews | Methods Primers, vol. 1, No. 18, pp. 1-21 (2021).
Wittry et al., "Properties of fixed-position Bragg diffractors for parallel detection of x-ray spectra," Rev. Sci. Instr. vol. 64, pp. 2195-2200 (1993).
Wobrauschek et al., "Micro XRF of light elements using a polycapillary lens and an ultrathin window Silicon Drift Detector inside a vacuum chamber," 2005, International Centre for Diffraction Data 2005, Advances in X-ray Analysis, vol. 48, pp. 229-235.
Wobrauschek et al., "Energy Dispersive, X-Ray Fluorescence Analysis," Encyclopedia of Analytical Chemistry, R.A. Meyers, Ed. (Wiley 2010).
Yamada et al., "Compact full-field hard x-ray microscope based on advanced Kirkpatrick-Baez mirrors," Optica, vol. 7, No. 4 pp. 367-370 (2020).
Yashiro et al., "Optimal Design of Transmission Grating for X-ray Talbot Interferometer", Advances in X-ray Analysis vol. 49(3) (2006), pp. 375-379.
Yashiro et al., "Efficiency of capturing a phase image using cone-beam x-ray Talbot interferometry", J. Opt. Soc. Am. A vol. 25 (2008), pp. 2025-2039.
Yashiro et al., "Hard-X-Ray Phase-Difference Microscopy Using a Fresnel Zone Plate and a Transmission Grating", Phys. Rev. Lett. vol. 103 (2009), 180801.
Yashiro et al., "Hard x-ray phase-imaging microscopy using the self-imaging phenomenon of a transmission grating", Phys. Rev. A vol. 82 (2010), 043822.
Yashiro et al., "On the origin of visibility contrast in x-ray Talbot interferometry", Opt. Express (2010), pp. 16890-16901.
Yashiro et al., "X-ray Phase Imaging Microscopy using a Fresnel Zone Plate and a Transmission Grating", in The 10th International Conference on Synchrotron Radiation Instrumentation, AIP Conf. Proc, vol. 1234 (2010), pp. 473-476.
Yashiro et al., "Distribution of unresolvable anisotropic microstructures revealed in visibility-contrast images using x-ray Talbot interferometry", Phys. Rev. B vol. 84 (2011), 094106.
Yashiro et al., "X-ray Phase Imaging and Tomography Using a Fresnel Zone Plate and a Transmission Grating", in "The 10th International Conference on X-ray Microscopy Radiation Instrumentation", AIP Conf. Proc, vol. 1365 (2011) pp. 317-320.
Yashiro et al., "Theoretical Aspect of X-ray Phase Microscopy with Transmission Gratings" in International Workshop on X-ray and Neutron Phase Imaging with Gratings, AIP Conf. Proc. vol. 1466, (2012), pp. 144-149.
Yoshioka et al., "Imaging evaluation of the cartilage in rheumatoid arthritis patients with an x-ray phase imaging apparatus based on Talbot-Lau interferometry," Scientific Reports, 10:6561, https://doi.org/10.1038/s41598-020-63155-9 (2020).
Zanette et al., "Two-Dimensional X-Ray Grating interferometer," Phys. Rev. Lett. vol. 105 (2010) pp. 248102-1 248102-4.
Zeeshan et al., "In-house setup for laboratory-based x-ray absorption fine structure spectroscopy measurements," Rev. Sci. Inst. 90, 073105 (2019).
Zeng et al., "Glass Monocapillary X-ray Optics and Their Applications in X-Ray Microscopy," X-ray Optics and Microanalysis: Proceedings of the 20th International Congress, AIP Conf. Proc. vol. 1221, (2010), pp. 41-47.
Zhang et al., "Application of confocal X-ray fluorescence based on capillary X-ray optics in nondestructively measuring the inner diameter of monocapillary optics," Optics Comm. (2018) https://doi.org/10.1016/j.optcom.2018.11.064.
Zhang et al., "Measurement of the inner diameter of monocapillary with confocal X-ray scattering technology based on capillary X-ray optics," Appl. Opt. (Jan. 8, 2019), doc ID 351489, pp. 1-10.
Zhou et al., "X-ray wavefront characterization with grating interferometry using an x-ray microfocus laboratory source," Proceedings, vol. 11492, Advances in Metrology for X-Ray and EUV Optics IX; 114920Q, https://doi.org/10.1117/12.2576152 (2020).
Anklamm et al., "A novel von Hamos spectrometer for efficient X-ray emission spectroscopy in the laboratory," Rev. Sci. Instr. vol. 85 p. 053110 (2014).
Birnbacher et al., "Quantitative X-ray phase contrast computed tomography with grating interferometry," European J. of Nucl. Med. and Mol. Imaging, https://doi.org/10.1007/s00259-021-05259-6 (2021).
Dibernardo, "Non-disruptive techniques for depth profiling in photoemission spectroscopy," Nature Review Physics, https://doi.org/10.1038/s42254-021-00331-4 (2021).
Du et al., "Removal of artifacts caused by grating imperfections in X-ray phase contrast tomography," J. of Inst. vol. 16, P06039, doi.org/10.1088/1748-0221/16/06/P06039 (2021).

(56) References Cited

OTHER PUBLICATIONS

Gaur et al., "On the method of calibration of the energy dispersive EXAFS beamline and Indus-2 and fitting theoretical model to the EXAFS spectrum," Sadhana, vol. 36, No. 3 pp. 3390348 (2011).

Gustschin et al., "High resolution and sensitivity bi-directional x-ray phase contrast imaging using 2D Talbot array illuminators," arXiv:2105.07347v1 [physics.med-ph] May 16, 2021.

Lei et al., "8-inch-diameter field of view for X-ray differential phase-contrast imaging," Nucl. Inst. And Methods in Physics Research A, https://doi.org/10-1016/j.nima.2021.165375 (2021).

Lin et al., "Quasi-Monte Carlo method for calculating X-ray scatter in CT," Op. Express, vol. 29, No. 9, p. 13746 (2021).

Nemeth et al., "Laboratory von Hamos X-ray Spectroscopy for Routine Sample Characterization," arvix:1607.08045v1 (2016).

Qiao et al., "Single-shot x-ray phase-contrast and dark-field imaging based on coded binary phase mask," Appl. Phys. Lett. 119, 011105 (2021).

Shi et al., "Laboratory X-ray interferometry imaging with a fan-shaped source grating," Optics Lett., doi.org/10.1364/OL.426867 (2021).

Streli et al., "Micro-X-ray fluorescence spectroscopy," Chapter I.9.f of "Imaging Modalities for Biological and Preclinical Research: A compendium, vol. 1, Part I: Ex vivo biological imaging," Ed. Walter et al., 8 pages, doi:10.1088/978-0-7503-3059-6ch42 (2021).

Tao et al., "Factors Affecting the Spatial Resolution in 2D Grating-Based X-Ray Phase Contrast Imaging," Frontiers in Physics, doi: 10.3389/fphy.2021.672207 (2021).

Witte et al., "From 2D STXM to 3D Imaging: Soft X-ray Laminography of Thin Specimens," Nano Lett. vol. 20, pp. 1305-1314 (2020).

Zan et al., "High-resolution multicontrast tomography with an X-ray microarray anodestructured target source," PNAS, doi.org10.1073/pnas.2103126118 (2021).

\* cited by examiner

X-RAY DARK-FIELD IN-LINE INSPECTION FOR SEMICONDUCTOR SAMPLES

CLAIM OF PRIORITY

This application claims the benefit of priority to U.S. Provisional Appl. No. 62/971,062 filed on Feb. 6, 2020 and incorporated in its entirety by reference herein.

BACKGROUND

Field

The present application relates generally to x-ray imaging/inspection systems.

Description of the Related Art

Advanced packaging in modern electronics includes microbumps and through silicon vias (TSVs) that join various integrated circuits (ICs) together in "2.5 dimensional" and/or "3 dimensional" packaging schemes. These features have been continuously scaled to smaller dimensions and have been altered to different materials. For example, lead solder bumps (e.g., with dimensions on the order of hundreds of microns) have now been replaced by microbumps (e.g., with dimensions of about 20-40 microns) that typically comprise a copper pillar and a silver/tin top layer above the copper pillar, with a thin nickel layer between the silver/tin top layer and the copper pillar.

Shrinking dimensions can result in less tolerance for defects, such as voids, in these features. In particular, the autonomous (e.g., self-driving) vehicle market demands zero tolerance for defects and 100% inspection. Such inspection is generally performed using x-rays, which have sufficient penetration and are also non-destructive, thereby enabling validation of every single packaging component. Additional failure mechanisms, such as silicon die cracks and delamination, are also of significant interest to the semiconductor field.

SUMMARY

In certain implementations, an x-ray imaging/inspection system is provided. The system comprises an x-ray source comprising a plurality of sub-sources in thermal communication with a substrate and that are configured to emit x-rays when bombarded by electrons configured to generate x-rays by electron bombardment of the target material. The system further comprises a first grating positioned to receive at least some of the x-rays from the x-ray source. The first grating comprises periodic structures configured to absorb at least some of the x-rays received from the x-ray source. The system further comprises a stage configured to hold a sample positioned to receive at least some of the x-rays from the x-ray source. The sample is configured to scatter and emit a first portion of the x-rays and to emit without scattering a second portion of the x-rays. The system further comprises at least one x-ray detector. The system further comprises a second grating positioned to receive at least some of the first portion of the x-rays and at least some of the second portion of the x-rays. The second grating comprises periodic structures configured to substantially block transmission of the second portion of the x-rays from reaching the at least one x-ray detector while substantially allowing transmission of the first portion of the x-rays to the at least one x-ray detector. The x-ray source, the first grating, and the second grating are configured such that a ratio of a pitch $p_0$ of the plurality of sub-sources to a pitch $p_2$ of the periodic structures of the second grating is substantially equal to a ratio of a distance $d_{S-G1}$ between the plurality of sub-sources and the first grating and a distance $d_{G1-G2}$ between the first grating and the second grating: $(p_0/p_2)=(d_{S-G1}/d_{G1-G2})$.

DETAILED DESCRIPTION

Figure 1A:
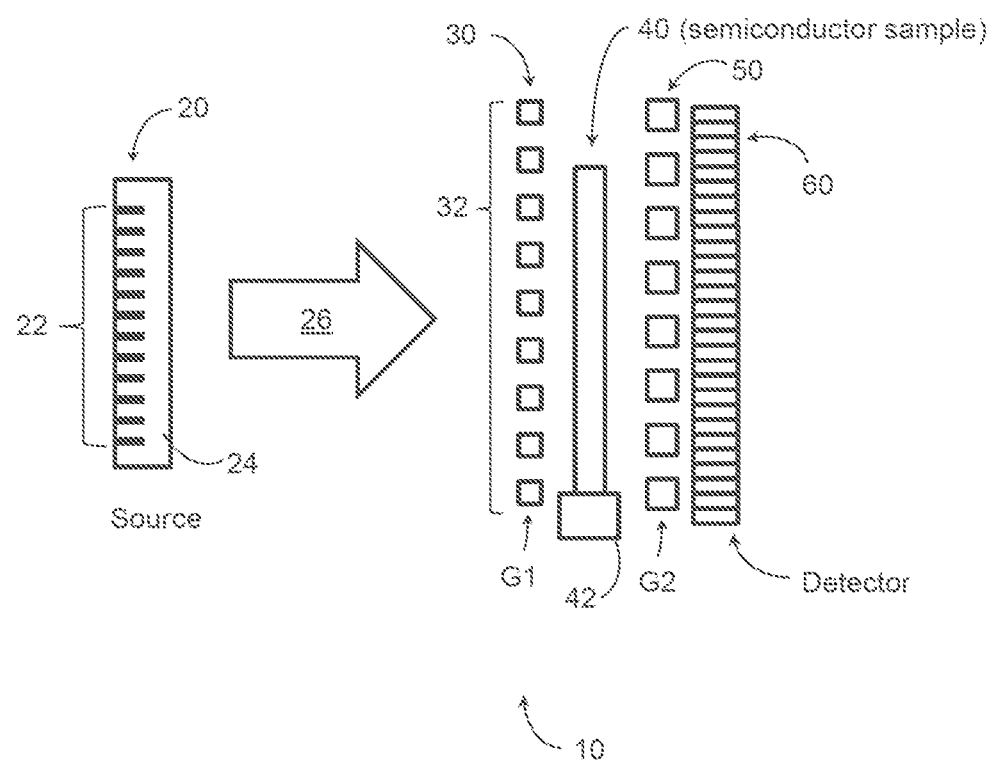
FIGS. 1A and 1B schematically illustrate an example system in accordance with certain implementations described herein.

Current inspection techniques center around analyzing the x-ray absorption across a two-dimensional (2D) region of the sample. However, the sensitivity of such techniques to voids decreases rapidly for smaller voids because the x-ray absorption by a sample region comprising such smaller voids is only slightly less than the absorption by a sample region without such smaller voids. Three-dimensional (3D) x-ray inspection schemes have been posited, but they are too slow for 100% inspection and they increase the radiation dose applied to the sample, which can be problematic for NAND flash memory by introducing defects caused by the increased radiation. Some inspection schemes use laminography (a "2.5 dimensional" technique), which offers some improvements in sensitivity.

X-ray dark-field (e.g., x-ray scattering) contrast is of interest because it is particularly sensitive to features (e.g., voids; cracks) with dimensions at the micron to submicron scale. X-ray dark-field contrast is fundamentally different than absorption contrast, which forms the basis of current x-ray imaging techniques and instead is based on measuring small angle x-ray scattering (SAXS). However, conventional SAXS is typically performed with systems that utilize long flight paths for collimation and that are not ideal for in-line semiconductor use.

Talbot-Lau interferometry is another inspection technique that simultaneously acquires absorption, phase, and dark-field contrasts using grating-based interferometry. A standard Talbot-Lau interferometer uses a large extended x-ray source coupled to a $G_0$ grating (e.g., source grating) having a 1:2 or 1:3 duty cycle, such that more than half of the x-rays produced by the x-ray source are absorbed by the absorptive struts of the $G_0$ grating. The $G_0$ grating effectively creates a linear or 2D array of periodic sub-sources of x-rays from the x-ray source that are transmitted through the $G_0$ grating. A $G_1$ grating (e.g., beam-splitting grating), which can be either an absorbing grating or a phase shifting grating, can be positioned downstream from the $G_0$ grating to diffract the x-rays such that a Talbot carpet of x-rays is formed which irradiates the sample being inspected. A $G_2$ grating (e.g., detector grating) can be typically positioned in front of (e.g., upstream from) a large pixel x-ray detector configured to detect the fringes of x-rays from the sample being inspected to determine absorption, phase, and dark-field (e.g., scattering) contrasts.

Talbot-Lau interferometry utilizes configurations that satisfy at least the following two conditions:

1. Talbot (coherence) condition to form fringes: Coherence is related to the width ($w_0$) of openings of the $G_0$ grating divided by the distance $d_{G0-G1}$ between the $G_0$ grating and the $G_1$ grating. Under the Talbot (coherence) condition, this quantity is smaller than the pitch $p_1$ of the $G_1$ grating divided by the wavelength $\lambda$ of the x-ray energy: $(d_{G0-G1} \times \lambda)/w_0 \cong p_1$.
2. Lau condition: A geometric relation in which the ratio of the pitch ($p_0$) of the $G_0$ grating to the pitch $p_2$ of the $G_2$ grating is equivalent to the ratio of the distance $d_{G0-G1}$ between the $G_0$ grating and the $G_1$ grating and the distance $d_{G1-G2}$ between the $G_1$ grating and the $G_2$ grating: $(p_0/p_2)=(d_{G0-G1}/d_{G1-G2})$. When the Lau condition is satisfied, the Talbot fringes downstream of the $G_1$ grating from an opening (e.g., micron-sized sub-source) of the $G_0$ grating is shifted by exactly one period, and from the nth neighbor opening of the $G_0$ grating is shifted by n number of periods. Therefore, the Talbot fringes from all the openings of the $G_0$ grating completely overlap, which is an important innovation, attributed to Lau, that enables the use of large extended x-ray sources with a $G_0$ grating.

However, Talbot-Lau interferometry utilizes phase-stepping (e.g., relative motion of the $G_1$ grating and the $G_2$ grating) so that the Talbot fringes can be sampled multiple times (e.g., at least three times if not more), and the time needed for such phase-stepping can adversely increase the overall time of the inspection. In addition, the absorption and phase contrast of Talbot-Lau interferometry are not necessary for defect detection and inspection. Furthermore, the Talbot condition sets a minimum to the distance $d_{G0-G1}$ between the $G_0$ grating and the $G_1$ grating, which can limit throughput.

Certain implementations described herein advantageously provide a dark-field-only inspection (e.g., imaging) system for semiconductor samples (e.g., a system that does not utilize absorption or phase contrast). Certain implementations described herein satisfy only the Lau condition (e.g., do not satisfy the Talbot condition). Certain implementations described herein utilize at least first and second absorption gratings in a magnifying arrangement (e.g., as in a projection microscope) in which the second absorption grating blocks x-rays passed by the first absorption grating in the absence of a sample from reaching the x-ray detector. Small angle scattering (e.g., due to edges and/or interfaces within the sample) provide x-rays that pass through the openings of the second absorption grating to be detected by an area x-ray detector positioned downstream from the second absorption grating. In certain implementations, the sample is positioned between the first and second absorption gratings.

Figure 1B:
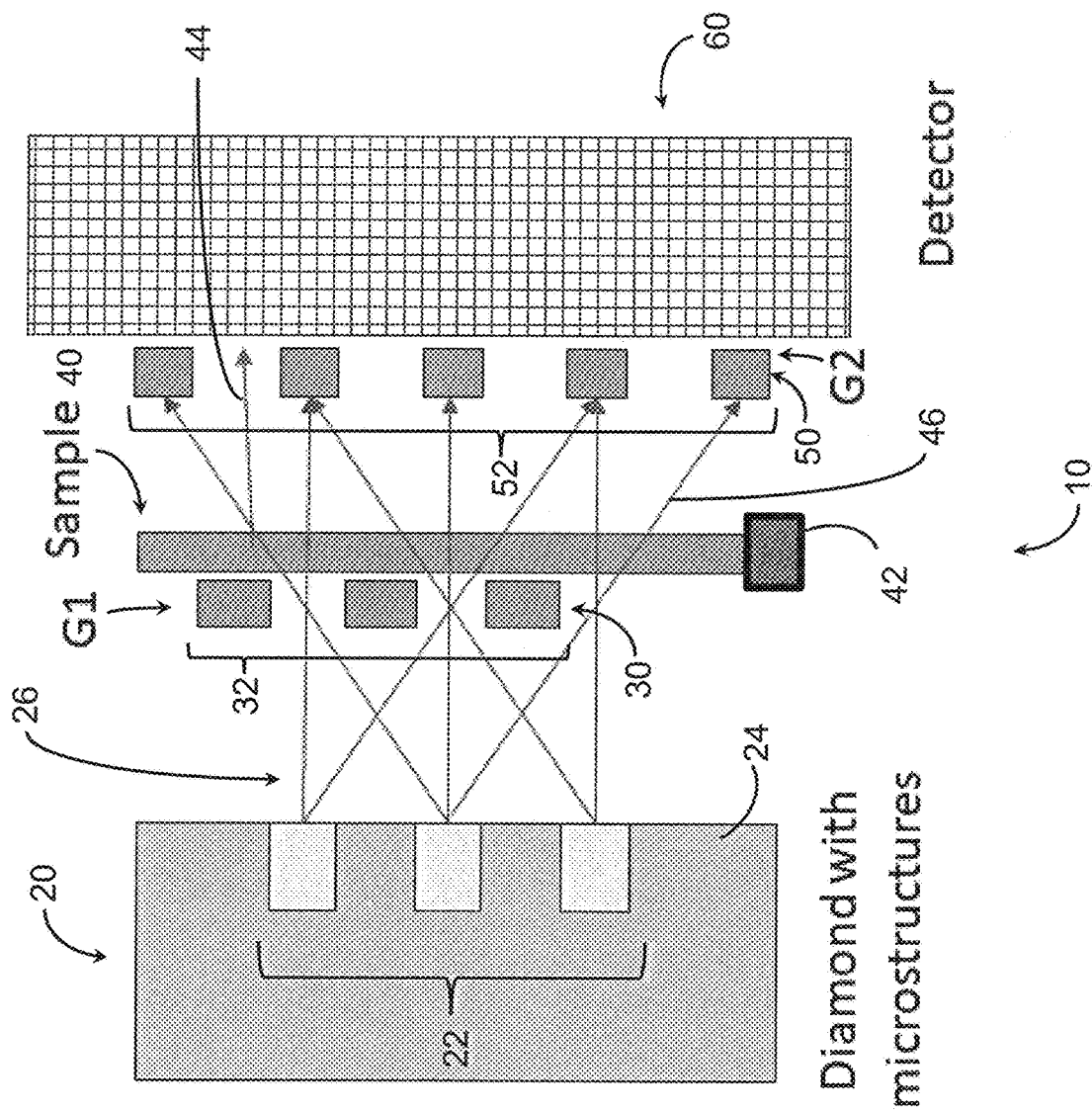

FIGS. 1A and 1B schematically illustrate an example system 10 that utilizes only dark-field contrast and satisfies only the Lau condition in accordance with certain implementations described herein. The example system 10 comprises an x-ray source 20 comprising a plurality of sub-sources 22 (e.g., one or more arrays of metal microstructures) in thermal communication with a substrate 24 (e.g., embedded or on a diamond substrate) and that are configured to emit x-rays 26 when bombarded by electrons (not shown). Examples of x-ray sources 20 with a plurality of sub-sources 22 compatible with certain implementations described herein are disclosed (in conjunction with other systems different from those described herein) in U.S. Pat. Nos. 9,390,881; 9,448,190; 9,449,781; 9,570,265; 9,543,109; 9,594,036; 9,719,947; 9,823,203; 9,874,531; 10,269,528; 10,295,485; 10,297,359; 10,304,580; 10,349,908; 10,352,880; 10,401,309, each of which is incorporated in its entirety by reference herein. Such x-ray sources 20 do not utilize a $G_0$ grating (e.g., source grating), which is different from conventional sources that combine a $G_0$ grating with an extended x-ray source.

The example system 10 further comprises a first grating 30 (e.g., "$G_1$ grating") positioned to receive at least some of the x-rays 26 from the x-ray source 20 (e.g., positioned downstream from the x-ray source 20), the first grating 30 comprising periodic structures configured to absorb at least some of the x-rays 26 received from the x-ray source 20. For example, the first grating 30 comprises an array of x-ray absorptive structures 32 that is periodic in a single dimension (e.g. lines of x-ray absorptive material). For another example, the first grating 30 comprises an array of x-ray absorptive structures 32 that is periodic in two dimensions (e.g., checkerboard, honeycomb, mesh, or grid of x-ray absorptive material). Examples of a first grating 30 (e.g., "$G_1$ grating") with periodic structures 32 compatible with certain implementations described herein are disclosed (in conjunction with other systems different from those described herein) in U.S. Pat. Nos. 9,719,947; 9,874,531; 10,304,580; 10,349,908; 10,352,880, each of which is incorporated in its entirety by reference herein.

The example system 10 further comprises a stage 42 configured to hold a sample 40, the sample 40 positioned to receive at least some of the x-rays 26 from the x-ray source 20 (e.g., positioned downstream from the x-ray source 20). The sample 40 is configured to scatter and emit a first portion 44 of the x-rays 26 and to emit without scattering (e.g., transmit) a second portion 46 of the x-rays 26. Examples of a stage 42 compatible with certain implementations described herein are disclosed (in conjunction with other systems different from those described herein) in U.S. Pat. Nos. 9,719,947; 9,874,531; 10,349,908; 10,352,880, each of which is incorporated in its entirety by reference herein.

The example system 10 further comprises a second grating 50 (e.g., "$G_2$ grating" or "$G_D$ grating") positioned to receive at least some of the first portion 44 of the x-rays 26 and at least some of the second portion 46 of the x-rays 26 (e.g., downstream from the sample 40). The example system 10 further comprises at least one x-ray detector 60 positioned to receive at least some of the first portion 44 of the x-rays from the second grating 50 (e.g., positioned downstream from the second grating 50). For example, the at least one detector 60 can comprise a spatially resolving detector (e.g., CCD or linear sensitivity detector). For another example, the at least one detector 60 can comprise a non-spatially resolving detector that simply measures the amount of scattered x-rays and is configured to monitor only changes in the dark-field scattered signal as an inspection technique. Examples of detectors 60 compatible with certain implementations described herein are disclosed (in conjunction with other systems different from those described herein) in U.S. Pat. Nos. 9,719,947; 9,874,531; 10,349,908; 10,352,880, each of which is incorporated in its entirety by reference herein.

As schematically illustrated by FIG. 1B, the second grating 50 comprises periodic structures configured to substantially block transmission of the second portion 46 of the x-rays 26 from reaching the at least one x-ray detector 60 while substantially allowing transmission of the first portion 44 of the x-rays 26 to the at least one x-ray detector 60. For example, the second grating 50 comprises an array of x-ray absorptive structures 52 that is periodic in a single dimension (e.g. lines of x-ray absorptive material). For another example, the second grating 50 comprises an array of x-ray absorptive structures 52 that is periodic in two dimensions (e.g., checkerboard, honeycomb, mesh, or grid of x-ray absorptive material). Examples of a second grating 50 (e.g., "$G_2$ grating" or "$G_D$ grating") with periodic structures 32 compatible with certain implementations described herein are disclosed (in conjunction with other systems different from those described herein) in U.S. Pat. Nos. 9,719,947; 9,874,531; 10,304,580; 10,349,908; 10,352,880, each of which is incorporated in its entirety by reference herein.

In certain implementations, the example system 10 is configured to meet the Lau condition in which the ratio of the pitch $p_0$ of the plurality of sub-sources 22 to the pitch $p_2$ of the array of x-ray absorptive structures 52 of the second grating 50 (e.g., $G_2$ grating) is substantially equal to the ratio of the distance $d_{S-G1}$ between the plurality of sub-sources 22 of the x-ray source 20 and the first grating 30 (e.g., $G_1$ grating) and the distance $d_{G1-G2}$ between the first grating 30 (e.g., $G_1$ grating) and the second grating 50 (e.g., $G_2$ grating): $(p_0/p_2)=(d_{S-G1}/d_{G1-G2})$. In addition, the second grating 50 of certain implementations is positioned such that x-rays 26 that directly propagate from the x-ray source 20 and that are collimated by the first grating 30 are substantially blocked by the second grating 50 from reaching the at least one x-ray detector 60, while scattered x-rays 26 are not substantially blocked by the second grating 50 from reaching the at least one x-ray detector 60.

In certain other implementations, as schematically illustrated by FIGS. 1A and 1B, the sample 40 is positioned behind (e.g., downstream from) the first grating 30 such that the sample 40 receives at least some of the x-rays 26 from (e.g., transmitted through) the first grating 30 and the second grating 50 is positioned behind (e.g., downstream from) the sample 40 to receive at least some of the first portion 44 of the x-rays 26 from the sample 40 and at least some of the second portion 46 of the x-rays 26 from the sample 40 (e.g., positioned downstream from the sample 40). Certain such implementations can be advantageous by protecting the sample 40 from being exposed to an unnecessary dose of x-rays. In certain implementations, the distance between the first grating 30 and the sample 40 and the distance between the second grating 50 and the at least one x-ray detector 60 are selected to be as small as practical as other operative constraints (e.g., compatibility for use in inspection of samples 40 while on a production/fabrication line) will allow. For example, for two-dimensional imaging, the distance between the first grating 30 and the sample 40 can be less than 10 mm. In certain implementations, the distance between the second grating 50 and the at least one x-ray detector 60 is selected to minimize the overall length of the system 10 (e.g., to provide a more compact form factor).

Sensitivity to larger voids can be increased in certain implementations by using larger distances between the sample 40 and the at least one x-ray detector 60, since the minimum angle of small angle x-ray detection is directly proportional to the opening width of the second grating 50 divided by the distance between the first grating 30 and the second grating 50. However, since increasing geometric magnification can reduce sensitivity due to smearing and can result in larger form factors, certain implementations limit the geometric magnification. For example, the geometric magnification of the sample 40 can be in the range of four to six and can be configured to improve sensitivity to larger voids (which have smaller scattering) and to use larger pixel sizes.

In certain implementations, the x-ray source 20, the first grating 30, and the second grating 50 are configured to satisfy the Lau condition, such that a ratio of a pitch $p_0$ of the plurality of sub-sources 22 to a pitch $p_2$ of the periodic structures 52 of the second grating 50 is substantially equal to a ratio of a distance $d_{S-G1}$ between the plurality of sub-sources 22 and the first grating 30 and a distance $d_{G1-G2}$ between the first grating 30 and the second grating 50: $(p_0/p_2)=(d_{S-G1}/d_{G1-G2})$. In certain such implementations, the x-ray source 20, the first grating 30, and the second grating 50 are further configured to not satisfy the Talbot condition, such that a ratio of a distance $d_{S-G1}$ between the x-ray source 20 and the first grating 30 and a spacing $w_0$ between adjacent sub-sources 22 of the plurality of sub-sources 22 is greater than a pitch $p_1$ of the first grating 30 divided by a wavelength $\lambda$ of the x-rays 26: $(d_{S-G1}/w_0)>(p_1/\lambda)$. In certain implementations, the x-ray source 20, the first grating 30, and the second grating 50 are further configured such that the distance between the first grating 30 and the sample 40 is small to maximize throughput (e.g., $d_{S-G1}$ is in a range of less than 3 mm or in a range of less than 50 mm).

Figure 1C:
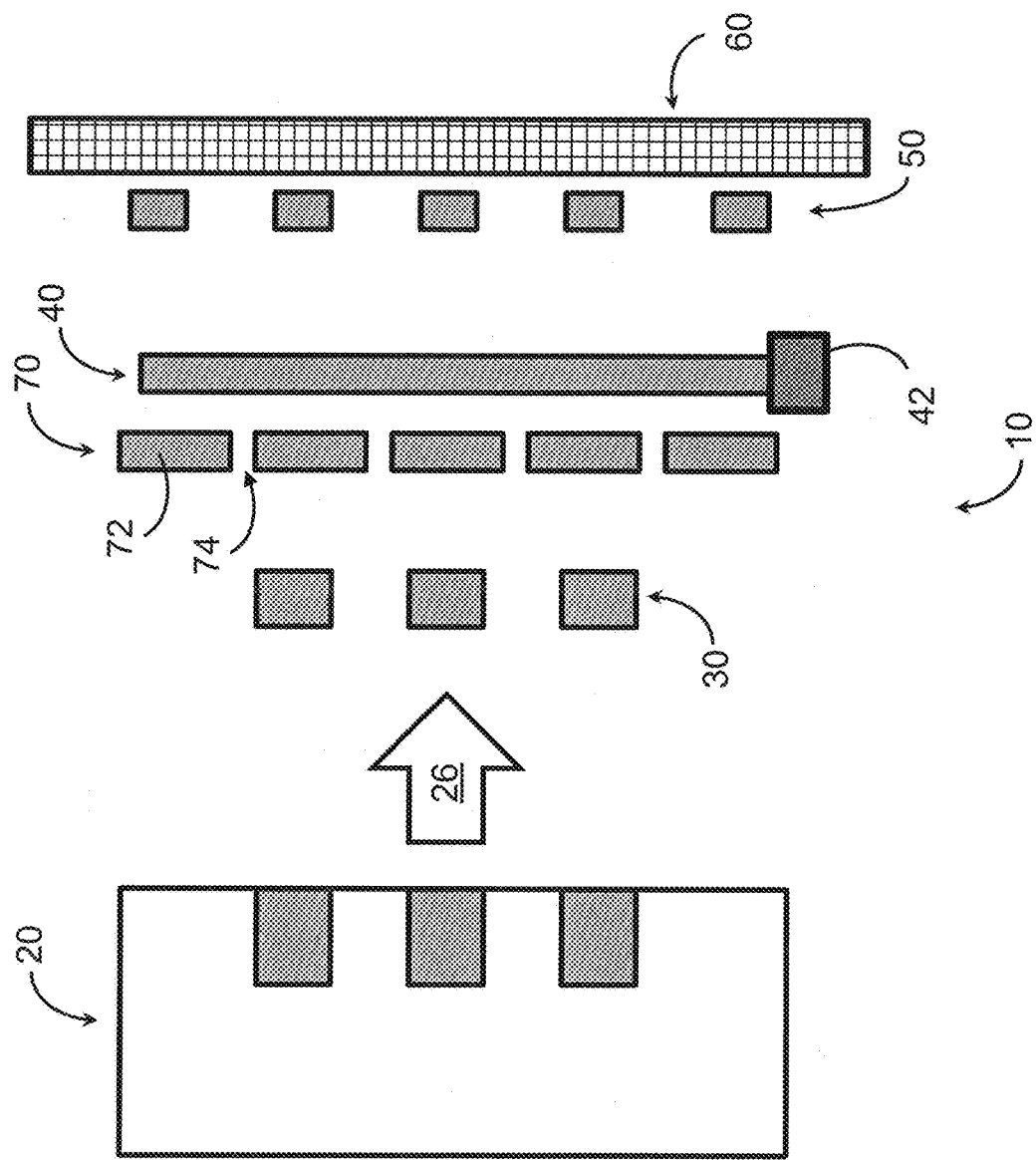
FIG. 1C schematically illustrates an example system comprising at least one mask in accordance with certain implementations described herein.

In certain implementations, as schematically illustrated by FIG. 1C, the system 10 comprises at least one mask 70 positioned in front of (e.g., upstream from) the sample 40. The at least one mask 70 comprises x-ray absorptive portions 72 (e.g., x-ray absorptive material) and x-ray transmissive portions 74 (e.g., openings), the x-ray transmissive portions 74 corresponding to (e.g., in registry with) the features of the sample 40 (e.g., vias; microbumps) under inspection. By substantially preventing x-rays from irradiating portions of the sample 40 between the features under inspection, and which would otherwise not contribute useful signal but would add to the radiation dosage received by the sample 40, certain implementations utilizing the at least one mask 70 advantageously reduce the background x-ray signal received by the at least one x-ray detector 60. Certain implementations utilizing the at least one mask 70 can advantageously improve image resolution by reducing (e.g., avoiding) photoelectron creation in regions of the x-ray detector 60 that do not correspond to the features under inspection and having these photoelectrons "bleed through" to the regions that do correspond to the features under inspection, with such photoelectrons reducing image resolution by contributing to the blurriness of the images. Certain implementations utilizing the at least one mask 70 advantageously protect the sample 40 from unnecessary x-ray dosage which could otherwise cause damage to the sample 40.

In certain implementations, only a relatively small fraction of the area of the at least one x-ray detector 60 receives scattered x-rays that are transmitted through the second grating 50. In certain such implementations, the x-ray source 20 can be configured to be controllably moved (e.g., in a direction parallel to a surface of the substrate 24) such that different regions of the at least one x-ray detector 60 receive the scattered x-rays (e.g., making use of parallax). In certain implementations, the x-ray detector 60 is not an imaging detector but is configured to provide information regarding the scattered x-rays corresponding to the features under inspection.

In certain implementations in which the sample 40 is moving during the inspection process (e.g., while the sample 40 travels along a production line), the x-ray source 20, the first and second gratings 30, 50, and the at least one mask 70 (for systems 10 comprising at least one mask 70) can be configured to be controllably moved along with the moving sample 40 to maintain the desired configuration. Alignment of the various components can be assured by using appropriate fiducials and servo-controlled alignment aids. In certain implementations, the sample 40 is rotated to acquire three-dimensional dark-field images.

Parameters of Example Implementations

In certain implementations, the x-ray source 20 comprises a plurality of sub-sources 22 that comprise microstructures that comprise tungsten, rhodium, molybdenum, or other high-Z elements. In certain implementations, the microstructures comprise a diffusion barrier between the microstructures and the substrate 24 (e.g., diamond).

In certain implementations, the x-rays 26 generated by the x-ray source 20 have a mean x-ray energy in a range of 20 keV to 30 keV, in a range of 30 keV to 50 keV, or in a range of 50 keV to 80 keV. The x-ray source 20 of certain implementations can comprise a filter configured to remove x-rays having energies below a predetermined value. In certain implementations, the substrate 24 is on a window (e.g., diamond window; beryllium window) at least partially bounding a vacuum region within the x-ray source 20 from a non-vacuum region outside the x-ray source 20. In certain other implementations, the substrate 24 is within an x-ray tube in a reflection geometry with the window (e.g., diamond window; beryllium window).

In certain implementations, the sub-sources 22 have a size (e.g., lateral dimension along a direction parallel to a surface of the substrate 24) in a range of 0.3 micron to 1 micron, in a range of 1 micron to 3 microns, or in a range of 3 microns to 10 microns. In certain implementations, the pitch $p_0$ is in a range that is comparable to the range of sizes of the sub-sources 22 (e.g., the pitch $p_0$ is in a range of 0.3 micron to 1 micron, in a range of 1 micron to 3 microns, or in a range of 3 microns to 10 microns). In certain implementations, a ratio of the size of the sub-sources 22 to the size of the space between adjacent sub-sources 22 is in a range of 1:1 to 1:2 or in a range of 1:2 to 1:3 (e.g., the ratio can be substantially equal to 1:3).

In certain implementations, the pitch $p_1$ for the first grating 30 (e.g., distance from a position on a first x-ray absorptive structure 32a to the equivalent position on a second x-ray absorptive structure 32b adjacent to the first x-ray absorptive structures 32a) can be in a range of 0.3 micron to 1 micron, in a range of 1 micron to 3 microns, in a range of 3 microns to 10 microns, or in a range of 10 microns to 50 microns. In certain implementations, the x-ray absorptive structures 32 of the first grating 30 are configured to block the spaces between adjacent x-ray absorptive structures 52 of the second grating 50 in a projection geometry. In certain such implementations, the first grating 30 has a first ratio of open to blocked areas and the second grating 50 has a second ratio of open to blocked areas that is larger than or equal to the first ratio (e.g., the first ratio equal to 1:1 and the second ratio in a range of 1:1 to 1:0.9 or in a range of 1:1 to 1:0.7). In certain implementations, the pitch $p_2$ for the second grating 50 (e.g., distance from a position on a first x-ray absorptive structure 52a to the equivalent position on a second x-ray absorptive structure 52b adjacent to the first x-ray absorptive structures 52a) can be in a range of 1 micron to 10 microns, in a range of 10 microns to 40 microns, in a range of 40 microns to 60 microns, in a range of 60 microns to 80 microns, or in a range of 80 microns to 200 microns. In certain implementations, the pitch $p_2$ is substantially equal to the pitch $p_1$ multiplied by $(d_{S-G2}/d_{S-G1})$, where $d_{S-G2}$ is the distance between the sub-sources 22 and the second grating 50 and $d_{S-G1}$ is the distance between the sub-sources 22 and the first grating 30.

In certain implementations, the distance $d_{S-G1}$ between the sub-sources 22 of the x-ray source 20 and the first grating 30 is in a range of 2 mm to 4 mm, in a range of 4 mm to 10 mm, in a range of 10 mm to 30 mm, in a range of 30 mm to 100 mm, or in a range of 100 mm to 500 mm. In certain implementations, the distance $d_{G1-G2}$ between the first grating 30 and the second grating 50 is in a range of 30 mm to 100 mm, in a range of 100 mm to 500 mm, or in a range of 500 mm to 1500 mm.

In certain implementations, the system 10 is configured to be used for inspection for defects in semiconductor packaging or other two-dimensional samples (e.g., as the samples are processed along the production line). In certain implementations, the system 10 is configured for dark-field imaging for medical use (e.g., clinical medical 2D x-ray). In certain implementations, the system 10 is configured to be used for laminography (e.g., 2.5D) in addition to 2D, or for dark-field tomography acquisition, or for three-dimensional imaging. For in-line semiconductor imaging implementations, the sample 40 can be placed on a conveyer belt such that a seconds-long dark-field image is obtained while the sample 40 is moving. For three-dimensional or laminography imaging implementations, the sample 40 can be placed in front of the first grating 30 (which is placed near the second grating 50 and the at least one x-ray detector 60) such that large samples 40 can be rotated. In certain implementations in which only small voids are of interest, the distance between the first grating 30 and the second grating 50 can be small and the overall size of the system 10 can be compact.

Figures 2A, 2B, 2C:
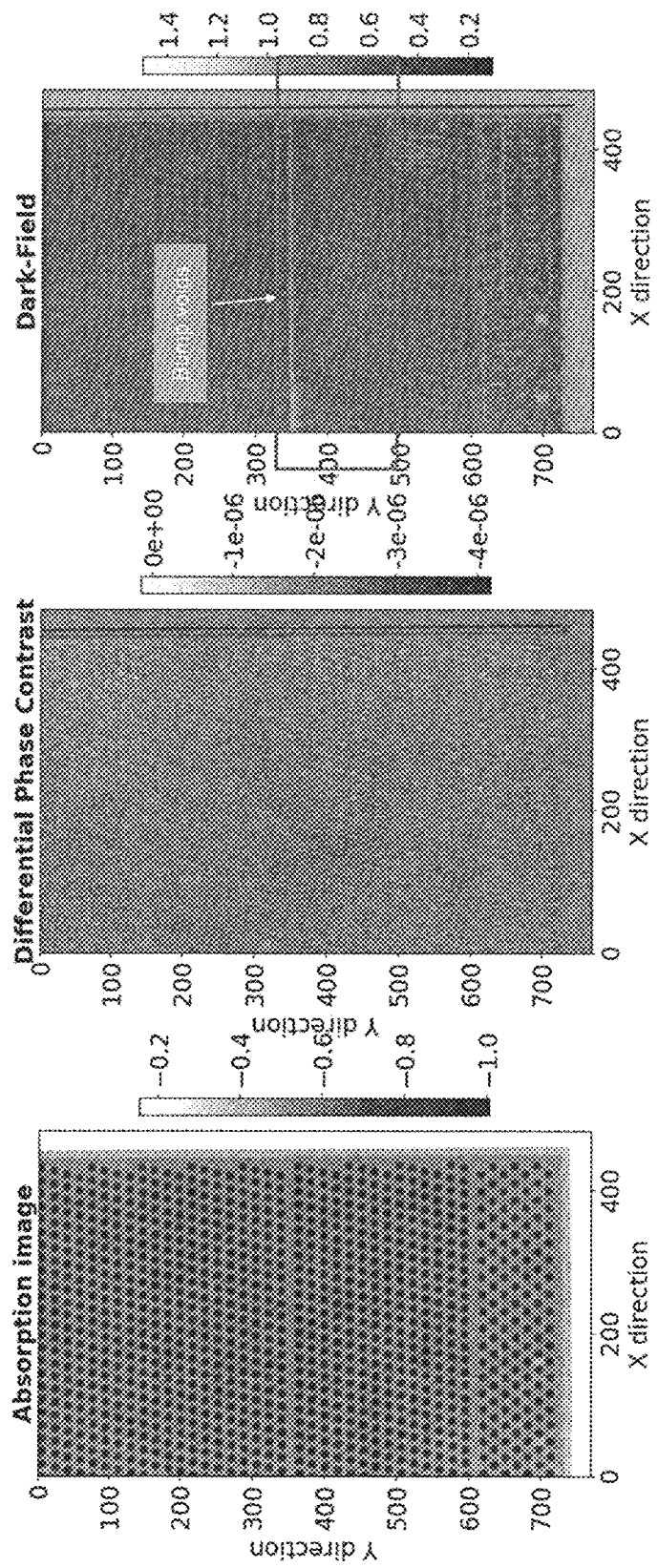
FIGS. 2A-2C show an absorption image, a differential phase contrast image, and a dark-field image, respectively, of a portion of a semiconductor sample comprising a plurality of microbumps under inspection in accordance with certain implementations described herein.

FIGS. 2A-2C show an absorption image, a differential phase contrast image, and a dark-field image, respectively, of a portion of a semiconductor sample comprising a plurality of microbumps under inspection in accordance with certain implementations described herein. The dark-field image of FIG. 1C shows regions (e.g., "white spots") at the centers of the microbumps that are indicative of voids. In addition, the dark-field images of certain implementations can show cracks and other features (e.g., substrate defects) that are not seen in conventional absorption imaging.

Although commonly used terms are used to describe the systems and methods of certain implementations for ease of understanding, these terms are used herein to have their broadest reasonable interpretations. Although various aspects of the disclosure are described with regard to illustrative examples and implementations, the disclosed examples and implementations should not be construed as limiting. Conditional language, such as "can," "could," "might," or "may," unless specifically stated otherwise, or otherwise understood within the context as used, is generally intended to convey that certain implementations include, while other implementations do not include, certain features, elements, and/or steps. Thus, such conditional language is not generally intended to imply that features, elements, and/or steps are in any way required for one or more implementations. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain implementations require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree. The ranges disclosed herein also encompass any and all overlap, sub-ranges, and combinations thereof. Language such as "up to," "at least," "greater than," "less than," "between," and the like includes the number recited. As used herein, the meaning of "a," "an," and "said" includes plural reference unless the context clearly dictates otherwise. While the structures and/or methods are discussed herein in terms of elements labeled by ordinal adjectives (e.g., first, second, etc.), the ordinal adjectives are used merely as labels to distinguish one element from another, and the ordinal adjectives are not used to denote an order of these elements or of their use.

Various configurations have been described above. It is to be appreciated that the implementations disclosed herein are not mutually exclusive and may be combined with one another in various arrangements. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various implementations and examples discussed above may be combined with one another to produce alternative configurations compatible with implementations disclosed herein. Various aspects and advantages of the implementations have been described where appropriate. It is to be understood that not necessarily all such aspects or advantages may be achieved in accordance with any particular implementation. Thus, for example, it should be recognized that the various implementations may be carried out in a manner that achieves or optimizes one advantage or group of advantages as taught herein without necessarily achieving other aspects or advantages as may be taught or suggested herein.

What is claimed is:

1. An x-ray imaging/inspection system comprising:
    an x-ray source comprising a plurality of sub-sources in thermal communication with a substrate and that are configured to emit x-rays when bombarded by electrons configured to generate x-rays by electron bombardment of the target material;
    a first grating positioned to receive at least some of the x-rays from the x-ray source, the first grating comprising periodic structures configured to absorb at least some of the x-rays received from the x-ray source;
    a stage configured to hold a sample positioned to receive at least some of the x-rays from the x-ray source, the sample configured to scatter and emit a first portion of the x-rays and to emit without scattering a second portion of the x-rays;
    at least one x-ray detector; and
    a second grating positioned to receive at least some of the first portion of the x-rays and at least some of the second portion of the x-rays, the second grating comprising periodic structures configured to substantially block transmission of the second portion of the x-rays from reaching the at least one x-ray detector while substantially allowing transmission of the first portion of the x-rays to the at least one x-ray detector,
    wherein the x-ray source, the first grating, and the second grating are configured such that a ratio of a pitch $p_0$ of the plurality of sub-sources to a pitch $p_2$ of the periodic structures of the second grating is substantially equal to a ratio of a distance $d_{S-G1}$ between the plurality of sub-sources and the first grating and a distance $d_{G1-G2}$ between the first grating and the second grating: $(p_0/p_2)=(d_{S-G1}/d_{G1-G2})$, wherein the second grating is positioned such that x-rays that directly propagate from the x-ray source and that are collimated by the first grating are substantially blocked by the second grating from reaching the at least one x-ray detector, while scattered x-rays from the sample are not substantially blocked by the second grating from reaching the at least one x-ray detector.

2. The x-ray imaging/inspection system of claim 1, wherein the plurality of sub-sources comprises one or more arrays of metal microstructures.

3. The x-ray imaging/inspection system of claim 2, wherein the microstructures comprise an atomic element selected from the group consisting of: W, Rh, Mo.

4. The x-ray imaging/inspection system of claim 2, wherein the substrate comprises diamond and the microstructures are on or embedded in the substrate.

5. The x-ray imaging/inspection system of claim 4, wherein the plurality of sub-sources further comprises a diffusion barrier between the microstructures and the substrate.

6. The x-ray imaging/inspection system of claim 1, wherein the first grating comprises an array of x-ray absorptive structures that is periodic in a single dimension or is periodic in two dimensions.

7. The x-ray imaging/inspection system of claim 6, wherein the array of x-ray absorptive structures is periodic in two dimensions and comprises a checkerboard, honeycomb, mesh, or grid of x-ray absorptive material.

8. The x-ray imaging/inspection system of claim 1, wherein the at least one detector comprises a spatially resolving detector.

9. The x-ray imaging/inspection system of claim 1, wherein the at least one detector comprises a non-spatially resolving detector.

10. The x-ray imaging/inspection system of claim 1, wherein the second grating comprises a second array of x-ray absorptive structures that is periodic in a single dimension or that is periodic in two dimensions.

11. The x-ray imaging/inspection system of claim 10, wherein the second array of x-ray absorptive structures is periodic in two dimensions and comprises a checkerboard, honeycomb, mesh, or grid of x-ray absorptive material.

12. The x-ray imaging/inspection system of claim 1, wherein the sample is positioned behind the first grating such that the sample receives at least some of the x-rays from the first grating and the second grating is positioned behind the sample to receive at least some of the first portion of the x-rays from the sample and at least some of the second portion of the x-rays from the sample.

13. The x-ray imaging/inspection system of claim 1, further comprises at least one mask positioned in front of the sample, the at least one mask comprising x-ray absorptive portions and x-ray transmissive portions, the x-ray transmissive portions corresponding to features of the sample under inspection, the x-ray absorptive portions configured to substantially prevent the x-rays from irradiating portions of the sample between the features under inspection.

14. The x-ray imaging/inspection system of claim 13, wherein the x-ray absorptive portions comprise an x-ray absorptive material and the x-ray transmissive portions comprise openings in the at least one mask.

15. The x-ray imaging/inspection system of claim 13, wherein the x-ray transmissive portions are in registry with features of the sample under inspection.

16. The x-ray imaging/inspection system of claim 1, wherein x-ray source, the first grating, and the second grating are configured such that a ratio of a distance $d_{S\text{-}G1}$ between the x-ray source and the first grating and a spacing $w_0$ between adjacent sub-sources of the plurality of sub-sources is greater than a pitch $p_1$ of the first grating divided by a wavelength $\lambda$ of the x-rays: $(d_{S\text{-}G1}/w_0) > (p_1/\lambda)$.

17. The x-ray imaging/inspection system of claim 1, wherein the x-ray source, the first grating, and the second grating satisfy the Lau condition but do not satisfy the Talbot condition.

\* \* \* \* \*